US008984343B2

(12) United States Patent
Schloegel et al.

(10) Patent No.: US 8,984,343 B2
(45) Date of Patent: Mar. 17, 2015

(54) ERROR PROPAGATION IN A SYSTEM MODEL

(75) Inventors: Kirk Schloegel, Minneapolis, MN (US); Devesh Bhatt, Maple Grove, MN (US); David V. Oglesby, Brooklyn Center, MN (US); Gabor Madl, St. Louis Park, MN (US)

(73) Assignee: Honeywell International Inc., Morristown, NJ (US)

( * ) Notice: Subject to any disclaimer, the term of this patent is extended or adjusted under 35 U.S.C. 154(b) by 719 days.

(21) Appl. No.: 13/167,983

(22) Filed: Jun. 24, 2011

(65) Prior Publication Data
US 2012/0210173 A1 Aug. 16, 2012

Related U.S. Application Data

(60) Provisional application No. 61/442,648, filed on Feb. 14, 2011.

(51) Int. Cl.
*G06F 11/00* (2006.01)
*G06F 11/36* (2006.01)

(52) U.S. Cl.
CPC .................. *G06F 11/3608* (2013.01)
USPC .......................................................... 714/37

(58) Field of Classification Search
CPC ................ G06F 11/36–11/3696; G06F 11/263
See application file for complete search history.

(56) References Cited

U.S. PATENT DOCUMENTS

| | | | |
|---|---|---|---|
| 5,150,367 A | 9/1992 | Tong et al. | |
| 5,272,704 A | 12/1993 | Tong et al. | |
| 5,729,554 A | 3/1998 | Weir et al. | |
| 5,913,023 A | 6/1999 | Szermer | |
| 5,918,037 A | 6/1999 | Tremblay et al. | |
| 6,002,869 A | 12/1999 | Hinckley | |
| 6,173,440 B1 | 1/2001 | Darty | |
| 6,449,667 B1 | 9/2002 | Ganmukhi et al. | |
| 6,473,794 B1 | 10/2002 | Guheen et al. | |
| 6,570,459 B1 | 5/2003 | Nathanson et al. | |
| 6,615,166 B1 | 9/2003 | Guheen et al. | |
| 6,671,874 B1 | 12/2003 | Passova | |
| 6,938,228 B1 | 8/2005 | Zhong | |
| 6,944,848 B2 | 9/2005 | Hartman | |
| 7,051,322 B2 | 5/2006 | Rioux | |
| 7,219,328 B2 | 5/2007 | Schloegel | |

(Continued)

FOREIGN PATENT DOCUMENTS

| EP | 1577755 | 9/2005 |
|---|---|---|
| EP | 1677187 | 7/2006 |

OTHER PUBLICATIONS

University of Regina, Physics Undergraduate Laboratory Companion, Chapter Three, Error Propagation in Calculations, Jul. 2008, pp. 9-20.*

(Continued)

*Primary Examiner* — Michael Maskulinski
(74) *Attorney, Agent, or Firm* — Fogg & Powers LLC

(57) ABSTRACT

Embodiments of the present subject matter can enable the analysis of signal value errors for system models. In an example, signal value errors can be propagated through the functional blocks of a system model to analyze possible effects as the signal value errors impact incident functional blocks. This propagation of the errors can be applicable to many models of computation including avionics models, synchronous data flow, and Kahn process networks.

20 Claims, 8 Drawing Sheets

(56) References Cited

U.S. PATENT DOCUMENTS

| | | | |
|---|---|---|---|
| 7,272,752 | B2 | 9/2007 | Farchi et al. |
| 7,296,188 | B2 | 11/2007 | Paternostro |
| 7,412,430 | B1 | 8/2008 | Moore |
| 7,457,729 | B2 | 11/2008 | Khoche et al. |
| 7,490,319 | B2 | 2/2009 | Blackwell et al. |
| 7,644,334 | B2 | 1/2010 | Hickman et al. |
| 7,698,668 | B2 | 4/2010 | Balasubramanian et al. |
| 7,735,058 | B2 | 6/2010 | Kinsella et al. |
| 8,397,187 | B2 | 3/2013 | Sawada |
| 8,423,879 | B2 | 4/2013 | Bhatt et al. |
| 8,539,451 | B2 * | 9/2013 | Ivancic et al. .......... 717/126 |
| 2003/0128214 | A1 | 7/2003 | Oglesby |
| 2004/0044990 | A1 | 3/2004 | Schloegel |
| 2004/0088677 | A1 | 5/2004 | Williams |
| 2004/0169591 | A1 | 9/2004 | Erkkinen |
| 2005/0004786 | A1 | 1/2005 | Thomason |
| 2005/0043913 | A1 | 2/2005 | Hyde et al. |
| 2005/0097515 | A1 | 5/2005 | Ribling |
| 2005/0114841 | A1 | 5/2005 | Moskowitz et al. |
| 2005/0223295 | A1 | 10/2005 | Hermes et al. |
| 2006/0010428 | A1 | 1/2006 | Rushby |
| 2006/0101402 | A1 | 5/2006 | Miller |
| 2006/0155520 | A1 | 7/2006 | O'Neill et al. |
| 2006/0206870 | A1 | 9/2006 | Moulden, Jr. |
| 2006/0253839 | A1 | 11/2006 | Avritzer |
| 2006/0265691 | A1 | 11/2006 | Klinger |
| 2007/0028219 | A1 | 2/2007 | Miller |
| 2007/0028220 | A1 | 2/2007 | Miller |
| 2007/0266366 | A1 | 11/2007 | Bucuvalas |
| 2007/0288899 | A1 | 12/2007 | Fanning et al. |
| 2008/0015827 | A1 | 1/2008 | Tryon, III et al. |
| 2008/0028364 | A1 | 1/2008 | Triou |
| 2008/0086705 | A1 | 4/2008 | Balasubramanian et al. |
| 2008/0120521 | A1 | 5/2008 | Poisson et al. |
| 2008/0126902 | A1 | 5/2008 | Hickman et al. |
| 2009/0083699 | A1 | 3/2009 | Santhanam |
| 2009/0287958 | A1 | 11/2009 | Bhatt et al. |
| 2009/0287963 | A1 | 11/2009 | Oglesby et al. |
| 2010/0175052 | A1 | 7/2010 | Prasad et al. |
| 2010/0192128 | A1 | 7/2010 | Schloegel et al. |
| 2011/0054835 | A1 | 3/2011 | Takamasu et al. |
| 2011/0258607 | A1 | 10/2011 | Bhatt et al. |
| 2011/0264990 | A1 | 10/2011 | Sawada |
| 2012/0185729 | A1 | 7/2012 | Bhatt et al. |

OTHER PUBLICATIONS

Agrawal et al., "Semantic Tranlation of Simulink/Stateflow Models to Hybrid Automata Using Graph Transformations", "Electronic Notes in Theoretical Computer Science", 2004, pp. 43-56, vol. 109.

Alur et al., "Symbolic Analysis for Improving Simulation Coverage of Simulink/Stateflow Models", "EMSOFT'08", Oct. 19-24, 2008, pp. 89-98, Published in: Atlanta, Georgia, USA.

Alur, "A Theory of Timed Automata", "Theorectical Computer Science", Apr. 1994, pp. 183-235, vol. 126, Publisher: Elsevier Science B.V.

Alur, "The Algorithmic Analysis of Hybrid Systems", "Theoretical Computer Science", Feb. 1995, pp. 3-34, No. 138.

Anirudhan et al., "Symbolic Test Generation for Hierarchically Modeled Digital Systems", "International Test Conference 1989", 1989, pp. 461-469, Publisher: IEEE, Published in: Washington DC, USA.

Benveniste, "The Synchronous Languages 12 Years Later", "Proceedings of the IEEE", Jan. 2003, pp. 64-83, vol. 91, No. 1, Publisher: IEEE.

Bhatt, D. et al., "Model-Based Development and the Implications to Design Assurance and Certification", "Digital Avionics Systems Conference", Oct. 30, 2005, pp. 1-14, vol. 2, Publisher: IEEE.

Bhatt et al., "Towards Scalable Verification of Commercial Avionics Software", "Proceedings of the AIAA Infotech@Aerospace Conference", Apr. 2010, pp. 1-8, Publisher: American Institue of Aeronautics and Astronautics, Published in: USA.

Bhatt et al., "HiLITE: An Approach and Tool for Test Generation from Model-Based Functional Requirements", "Presentation—1st International Workshop on Aerospace Software Engineering", May 22, 2007, pp. 1-32, Publisher: Honeywell International Inc.

Bhatt, "Towards Scalable Verification of Commercial Avionics Software", "In Proceedings of the AIAA Infotech at Aerospace Conference", Apr. 2010, pp. 1-7, Publisher: American Institute of Aeronautics and Astronautics.

Bhatt, "An Approach and Tool for Test Generation From Model-Based Functional Requirements", May 2007, pp. 1-6, Publisher: Honeywell Laboratories, Minneapolis.

Bhatt, D. et al., "HiLite-Honeywell Integrated Lifecycle Tools and Environment", "Aerospace Advanced Technology-Slides Version 2", Apr. 2008, pp. 1-28, Publisher: Honeywell.

Borcsok et al., "An Automated Software Verification Tool for Model-based Development of Embedded Systems with Simulink", "XXII International Symposium on Information, Communication and Automation Technologies", 2009, pp. 1-6, Publisher: IEEE.

Durrieu, "Formal Proof and Test Case Generation for Critical Embedded Systems Using Scade", "World Computer Congress-IFIP", 2004, pp. 499-504, vol. 156.

Ferrell, "RTCA DO-17B/EUROCAE ED-12B", 2001, pp. 1-11, No. 27, Publisher: CRC Press LLC.

Fosdick, et al., "Data Flow Analysis in Software Reliability", "Computing Surveys", Sep. 1976, pp. 305-330, vol. 8, No. 3, Publisher: Association for Computing Machinery (ACM), Published in: Boulder, Colorado, US.

Halbwachs et al., "The Synchronous Dataflow Programming Language Lustre", "Proceedings of the IEEE", Sep. 1991, pp. 1-41, vol. 79, No. 9, Publisher: IEEE.

Hamon, "An Operational Semantics for Stateflow", "International Journal on Software Tools for Technology Transfer (STTT)", Oct. 2007, pp. 447-456, vol. 9, No. 5-6, Publisher: SRI International.

Hamon, "A Denotational Semantics for Stateflow", "In Proceedings of EMSOFT", 2005, pp. 164-172, Publisher: EMSOFT '05.

Harel, "Statecharts: A Visual Formalism for Complex Systems", "Science of Computer Programming", 1987, pp. 231-274, vol. 8, Publisher: Elsevier Science Publishers B.V.

Henzinger et al., "What's Decidable About Hybrid Automata?", "Journal of Computer and System Sciences", 1998, pp. 1-48, vol. 57.

Hi-Keung, "Test Generation for Sequential Circuits", "IEEE Transactions on Computer Aided Design of Integrated Circuits and Systems", Oct. 1, 1988, pp. 1081-1093, vol. 7, No. 10, Publisher: IEEE, Published in: Piscataway, NJ, USA.

"LDRA Tool Suite", "http://www.ldra.com/ Accessed May 11, 2011", 2011, pp. 1 Publisher: LDRA Ltd.

"Matlab and Simulink", "http://www.mathworks.com/ Accessed May 11, 2011", 1994-2011, pp. 1 Publisher: The MathWorks, Inc.

"Vector Software. Vectorcast.", "http://www.vectorcast.com/ Accessed on May 11, 2011", 2011, pp. 1 Publisher: Vector Software.

Kahn, "The Semantics of a Simple Language for Parallel Programming", "In Information Processing", 1974, pp. 471-475.

Lee, "Synchronous Data Flow", "Proceedings of IEEE", Sep. 1987, pp. 1235-1245, vol. 75, No. 9, Publisher: IEEE.

"Simulink—Simulation and Model-Based Design", "http://www.mathworks.com/products/simulink accessed Sep. 1, 2010", 2007, pp. 1-6, Publisher: The MathWorks, Inc.

Moore, R.E., "Interval Arithmetic and Automatic Error Analysis in Digital Computing", "Applied Mathematics and Statistics Laboratories", Nov. 15, 1962, pp. 1-145, No. 25, Publisher: Stanford University California.

Neema, S. et al., "Signal Processing Platform: A Tool Chain for Designing High Performance Signal Processing Applications", "Proceedings IEEE", Apr. 8-10, 2005, pp. 302-307, Publisher: Southeastcon, Published in: Ft. Lauderdale, FL.

Niermann et al., "HITEC: A Test Generation Package for Sequential Circuits", "Proceedings of the European Conference on Design Automation", 1991, pp. 214-218, Publisher: IEEE, Published in: Los Alamitos, CA, USA.

"OMG Unified Modeling Language Specification, version 1.5", Mar. 1, 2003, pp. 3-135 to 3-154, vol. 3, No. 9, Publisher: Object Management Group (OMG).

(56) References Cited

OTHER PUBLICATIONS

Ouaknine, "On the Language Inclusion Problem for Timed Automata: Closing a Decidability Gap", "In Proceedings of Logic in Computer Science", 2004, pp. 54-63.

Petri, "Communication With Automata", "PhD Thesis", Jan. 1966, pp. 1-97, vol. 1, Publisher: University of Bonn.

Rushby, "An Evidential Tool Bus", "Proc. of 7th International Conference on Formal Engineering Methods", 2005, pp. 1-10, Publisher: SRI International, Published in: Menlo Park, California, USA.

"Quantifying Error Propagation in Data Flow Models", , pp. 1-10, Publisher: Honeywell Aerospace Advanced Technology.

Sorensen, Uffe, "Static Single-Assignment Form and Value Range Propagation for UPPAAL", "available at http://www.uffesorensen.dk/Uni/dat8/SSA_and_VRP_for_UPPAAL.pdf", Jun. 2008, pp. 1-81.

"Stateflow 7-Design and Simulate State Machines and Control Logic", 2007, pp. 1-6, Publisher: The Mathworks.

Tiwari, "Formal Semantics and Analysis Methods for Simulink Stateflow Models", "http://www.csl.sri.com/users/tiwari/html/stateflow.html Accessed May 11, 2011", 2002, pp. 1-12, Publisher: SRI International.

Tripakis et al., "Translating Discrete-Time Simulink to Lustre", "ACM Journal Name", Jan. 2005, pp. 1-40, vol. V, No. N.

Bhatt, "Method for Automated Error Detection and Verification of Software", "U.S. Appl. No. 12/949,596, filed Nov. 18, 2010", pp. 1-16.

"Scade Suite", "http://www.esterel-technologies.com/ Accessed May 11, 2011", 2011, pp. 1-4, Publisher: Esterel Technologies, Inc., Published in: France.

Zhou et al., "A Framework of Hierarchical Requirements Patterns for Specifying Systems of Interconnected Simulink/Stateflow Modules", 2007, pp. 1-6.

European Patent Office, "Office Action" from Foreign Counterpart of U.S. Appl. No. 12/949,596, Jan. 19, 2012, Published in: EP.

European Patent Office, "European Search Report" from Foreign Counterpart of U.S. Appl. No. 13/006,750, mailed Mar. 9, 2012, Published in: EP.

European Patent Office, "Office Action" from Foreign Counterpart of U.S. Appl. No. 13/006,750, Jul. 2, 2012, Published in: EP.

U.S. Patent and Trademark Office, "Final Office Action", "from U.S. Appl. No. 13/006,750", Sep. 12, 2013, pp. 1-22, Published in: US.

Diwan et al., "Simple and Effective Analysis of Statically-Typed Object-Oriented Programs", "retrieved from http://pdf.aminer.org/000/522/075/simple_and_effective_analysis_of_statically_typed_object_oriented_programs.pdf on Sep. 5, 2013", 1996, pp. 1-15.

Gough et al., "Eliminating Range Checks using Static Single Assignment Form", "retrieved from http://citeseerx.ist.psu.edu/viewdoc/download?doi=10.1.1.55.207&rep1&type=pdf on Sep. 4, 2013", 1994, pp. 1-16.

Schulte et al, "Dynamic Analysis of Bounds Versus Domain Propagation", "Logic Programming", Dec. 9, 2008, pp. 332-346, Publisher: Springer Berlin Heidelberg.

U.S. Patent and Trademark Office, "Office Action", "U.S. Appl. No. 13/006,750", May 17, 2013, pp. 1-53.

Blume et al., "Symbolic Range Propagation", 1995, pp. 357-363.

Harrison, "Compiler Analysis of the Value Ranges for Variables", "IEEE Transactions on Software Engineering", May 1977, pp. 243-250, vol. SE-3, No. 3.

U.S. Patent and Trademark Office, "Advisory Action", "from U.S. Appl. No. 13/006,750", Nov. 21, 2013, pp. 1-4, Published in: US.

U.S. Patent and Trademark Office, "Office Action", "from U.S. Appl. No. 13/006,750", Apr. 25, 2014, pp. 1-29, Published in: US.

\* cited by examiner

ERROR PROPAGATION IN A SYSTEM MODEL

CROSS-REFERENCE TO RELATED APPLICATIONS

This application claims the benefit of priority to U.S. Provisional Patent Application Ser. No. 61/442,648 entitled "Method to Propagate Error Associated with Type, Range, and Signal Value Data through a Behavioral Model" filed on Feb. 14, 2011, the disclosure of which is hereby incorporated herein by reference in its entirety.

STATEMENT REGARDING FEDERALLY SPONSORED RESEARCH OR DEVELOPMENT

This invention was made with Government support under Contract No. NNA10DE73C awarded by NASA. The Government may have certain rights in the invention.

BACKGROUND

Model-based design can be used for hardware and software systems (e.g., cyber-physical systems (CPSs)). Data flow semantics can be used to specify control algorithms. One area in which model-based design is increasingly applied is for the design and certification of flight-critical software. In this area, MATLAB Simulink and Esterel Technologies SCADE, in particular, are widely used in the aerospace industry for modeling and simulation-based evaluation of avionics CPSs. Both Simulink and SCADE use data flow models for model-based design.

Verification tools exist to analyze type and range data in the context of data flow models, according to the DO-178B software certification process. Such tools can automate a number of previously manual tasks, including code reviews, model analysis, and object code testing.

SUMMARY

One exemplary embodiment is directed to a method providing an input signal range corresponding to a range of expected values for an input signal to a functional block. A minimum value error range corresponding to a range of error for a minimum value endpoint of the input signal range and a maximum value error range corresponding to a range of error for a maximum value endpoint of the input signal range is also provided. The method maps the input signal range to one or more output signal ranges as a function of a range mapping function corresponding to the functional block. The method also calculates a set of error extended input signal ranges by: adding a min endpoint of the minimum value error range to the minimum value of the input signal range; adding a max endpoint of the minimum value error range to the minimum value of the input signal range; adding the min endpoint of the maximum value error range to the maximum value of the input signal; and adding the max endpoint of the maximum value error range to the maximum value of the input signal range. The set of error extended input signal ranges are mapped to a set of error extended output signal ranges as a function of the range mapping function. Finally, a minimum output error range and a maximum output error range are calculated as a function of a difference between the set of error extended output signal ranges and the output signal ranges.

DRAWINGS

Understanding that the drawings depict only exemplary embodiments and are not therefore to be considered limiting in scope, the exemplary embodiments will be described with additional specificity and detail through the use of the accompanying drawings.

Figure 1:
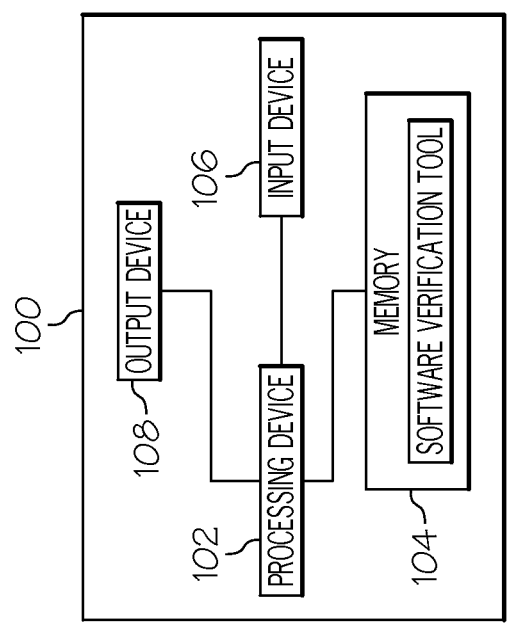
FIG. 1 illustrates a computer for execution of a software verification tool in accordance with one embodiment.

In accordance with common practice, the various described features are not drawn to scale but are drawn to emphasize specific features relevant to the exemplary embodiments.

DETAILED DESCRIPTION

In the following detailed description, reference is made to the accompanying drawings that form a part hereof, and in which is shown by way of illustration specific illustrative embodiments. However, it is to be understood that other embodiments may be utilized and that logical, mechanical, and electrical changes may be made. Furthermore, the method presented in the drawing figures and the specification is not to be construed as limiting the order in which the individual steps may be performed. The following detailed description is, therefore, not to be taken in a limiting sense.

Current software verification tools do not directly handle errors associated with signal values (also referred to herein as "signal value errors"). A signal value error can occur when a representation of a signal value, over which computation is performed, is different than its corresponding ground truth values. That is, a signal value error can include a difference between an actual output signal from a component in a system and the ideal output signal from the component.

This challenge is commonly faced when abstractions, assumptions, and restrictions are utilized with the goal of increasing the scalability of analysis methods. For example, synchronous languages can rely on synchrony and zero-time execution assumptions that are typically not valid in a physical implementation.

One example of an abstraction includes a floating-point representation of certain numeric values. This floating-point representation error is generally proportional to signal magnitude. In other words a bound for a signal value of one million will tend to be greater than a bound for a signal value of ten or one. This is because correct rounding may be performed only to a limited number of decimal places (e.g., 7 for 32-bit floats, 16 for 64-bit floats, and 34 for 128 bit floats). If a decision within a system is dependent upon an expression using floating-point rounding, the resulting behavior may not be deterministically predictable. Additionally, this source of error can be exacerbated for accumulated error. For example, for a loop in which a 32-bit float variable is incremented a thousand times, the effect of the error can be present in values near one hundred thousand rather than one hundred million.

A second source of signal value error can be due to hardware floating-point units that may produce signal value error. So, for example, even if two floating-point values that have no error are multiplied together, the result can still have signal value error.

A third source of signal value error can be due to mixed continuous and discrete computation. For example, a continuous sensor signal can be periodically buffered and reported. Clock skew, however, can result in the continuous signal being captured too early to too late, which may result in a value different from the ground truth value. Also, when computation uses periodic data that is sampled between periods, interpolation can be used. Since interpolation is an estimate, signal value error can be produced from interpolation. These error sources tend to be bounded. For example, the error arising from clock skew can be bounded by the maximum rate of signal change corresponding to the maximum clock skew.

Yet another source of signal value error is sensor accuracy. This source of error can be constant (e.g., plus or minus 0.001) across a range of operational values and undefined outside of this range.

Signal value errors can lead to differences between the semantics of system models and the actual behavior of the system observed on an execution platform. By quantifying the differences between the "ideal" case and the actual behavior, the effects of errors can be systematically analyzed, and the correctness of the implementation can be shown in the presence of errors.

Not only can output values be different than ground truth (e.g., ideal) values, but signal value error may also result in timing jitter as errors push condition values across discrete decision points in the code. Essentially, signal value errors can non-deterministically affect the behavior and performance of the system controlled by the software.

Conventional systems have been certified by relying on the argument that the error is bounded. In these previous approaches, a static and conservative error threshold (e.g., a tolerance) has been applied to an output signal of the model. That is, an output signal value for a model is compared to an error interval for that output signal. If the output signal value is outside of the interval, the output signal is considered to have failed. Each output signal can have a different error threshold. However, the sizes of the intervals typically depend upon the underlying data type. Analysis is typically not performed to determine whether the particular tolerance is appropriate for the given model. Accordingly, the error for a given signal is not propagated through the system.

For example, if a tolerance is plus or minus 0.0001 and an output signal value of 2.13 is expected, but a value of 2.12999999 is measured, the test is considered passed. This is because $2.13-0.0001<2.12999999<2.13+0.0001$.

As system complexity has increased, a signal static tolerance factor can be overly conservative in most cases, while not being conservative enough in rare cases. Furthermore, applying a tolerance to output signals does not provide a mechanism to analyze timing jitter and potential for non-deterministic behavior that may originate from signal value error.

Embodiments of the present subject matter can enable the analysis of signal value errors for system models. In an example, signal value errors can be propagated through the functional blocks of a system model to analyze possible effects as the signal value errors impact incident functional blocks. This propagation of the errors can be applicable to many models of computation including avionics models, synchronous data flow and Kahn process networks.

Signal value errors can have a number of sources. One potential source includes a floating-point representation of certain numeric values. This can be one of the most widespread sources of error in the modeling of practical flight-critical systems.

Accordingly, the characteristics of each source of signal value error can be different. Embodiments of the subject matter described herein can represent these different error characteristics and can enable translation between these error characteristics.

In an example, the subject matter herein can be used to determine a magnitude of error on an output of a system given a characterization of signal value error for input signal(s) to the system. In an example, the subject matter herein can be used to determine if signal value error can non-deterministically change the behavior of the system. For example, the subject matter herein can be used to identify if and where signal value error can potentially cause a mode change to occur too early or too late.

In an example, the subject matter herein can be used to detect error-induced underflow. Underflow can include the condition when the result of a floating-point operation is smaller than the smallest representable value. For example, if a feedback loop increments a signal by one each period and the signal is stored as a 32-bit float, after the signal increments to near 100,000,000 the rounding error may negate the increment operation. Thus, the signal might not ever reach a particular value that is greater than 100,000,000. Error-induced underflow is similar, but can be due to any source of signal value error. Error-induced underflow can be detected by quantifying the signal value error for an output signal from a functional block and determining if the signal value error can negate the operation performed by the functional block.

In an example, the subject matter herein can be used to determine if signal value error can move ranges of an output signal from a functional block outside of accepted range. An output signal outside of the accepted range can cause overflows or exceptions. Analyzing the range of output signals with signal value error propagation can be used to determine whether anomalous behavior is possible for the system.

FIG. 1 illustrates a computer 100 for execution of a software verification tool. The computer 100 can include one or more processing devices 102 (e.g., a central processing unit (CPU), microcontroller, microprocessor, etc.) coupled to one or more memory devices 104 (e.g., random access memory (RAM), a hard drive, an optical medium (CD), etc.). The one or more memory devices 104 can include instructions which, when executed by the one or more processing devices 102, can cause the one or more processing devices 102 to perform the functions of a software verification tool as described herein.

Separate from or in addition to the one or more memory devices 104, the instructions can be stored on any appropriate computer readable medium used for storage of computer readable instructions or data structures. The computer readable medium can be implemented as any available media that can be accessed by a general purpose or special purpose computer or processor, or any programmable logic device. Suitable processor-readable media can include tangible media such as magnetic or optical media. For example, tangible media can include conventional hard disks, Compact Disk-Read Only Memory (CD-ROM), volatile or non-volatile media such as Random Access Memory (RAM) (including, but not limited to, Synchronous Dynamic Random Access Memory (SDRAM), Double Data Rate (DDR) RAM, RAMBUS Dynamic RAM (RDRAM), Static RAM (SRAM), etc.), Read Only Memory (ROM), Electrically Erasable Programmable ROM (EEPROM), and flash memory, etc. Suitable processor-readable media can also include transmission media such as electrical, electromagnetic, or digital signals, conveyed via a communication medium such as a network and/or a wireless link.

In an example, the computer 100 can include one or more input devices 106 (e.g., a mouse, keyboard, touchscreen, microphone, etc.) for receiving inputs from a user. The computer 100 can also include one or more output devices 108 (e.g., a monitor, speaker, light, etc.) for providing output to a user. The computer 100 can comprise a desktop computer, workstation, laptop, tablet, mobile phone, or other computing device. In some examples, the computer 100 can be distributed in nature.

As mentioned above, the instructions on the one or more memory device 104 can cause the one or more processing device 102 to perform the functions of a software verification tool as described herein. In an example, the software verification tool can utilize an extension of interval arithmetic to represent ranges of feasible signal values in order to support the computation of range propagation and analysis.

An interval may be represented by the tuple I=(min, max, includeMin, includeMax) where min represents the lower bound endpoint of the interval, max represents the upper bound endpoint of the interval, includeMin indicates if the min value is included in the interval, includeMax indicates if the max value is included in the interval. As used herein, the common interval notation of the min and max values enclosed in parentheses or brackets depending on whether or not the associated endpoint is included in the internal. For example, the interval (3, 7] indicates the interval I=(3, 7, false, true).

A range may be comprised of a set of intervals. In one embodiment, the set of intervals may be a non-overlapping set of intervals.

A range can include data type information. Data type information may be used for checking for value overflow and underflow and to guide certain type-specific range operations. The data type information can indicate the included set of values between the min and max endpoints. If data type information in unavailable, a default data type can be assigned.

In one embodiment a range can include a property "type" from the set T, where T={Boolean, Integer8, Integer16, Integer32, Integer64, Unsigned8, Unsigned16, Unsigned32, Unsigned64, Float32, Float64, Undefined}. Other sets of types are also possible.

A range can be specified as the tuple R=(min, max, includeMin, includeMax, C, T), where: min represents the lowest bound endpoint of all min values of all included intervals, max represents the upper bound endpoint of all max values of all included intervals in the range, includeMin indicates if the min value is included in the range, includeMax indicates if the max value is included in the range, C is the ordered set of intervals. For example, the range [1, 5] may include the intervals [1, 2) and [2, 5]. In one embodiment, a range can be hierarchically composed of multiple non-overlapping child ranges.

In an example, the software verification tool can use a model of a system under test having one or more functional blocks connected according to a graph structure. In an example, the graph structure can include a directed graph. The software verification tool can use the model to compute one or more ranges for one or more output signals from the model. In an example, the software verification tool can use the model along with specifications for one or more ranges of one or more input signals to the model to compute the one or more ranges for the one or more output signals. To compute the range(s) for the output signal(s), the software verification tool can propagate the range(s) for the input signal(s) topologically through the functional blocks until the output signal (s) are reached. A functional block v of the set V can have a set of inputs (X) and a set of outputs (Y), corresponding to edge sources and targets. A functional block can map one or more ranges for one or more input signals for the functional block to one or more ranges for one or more output signals for the functional block. The mapping of an output signal for a functional block from one or more input signals for the functional block can be defined by a range mapping function. Different output signals for a functional block can have different range mapping functions corresponding thereto. The range mapping function(s) for a functional block can be used to determine the range(s) for the output signal(s) for the functional block as a function of the range(s) of the input signal(s) for the functional block.

Figure 2:
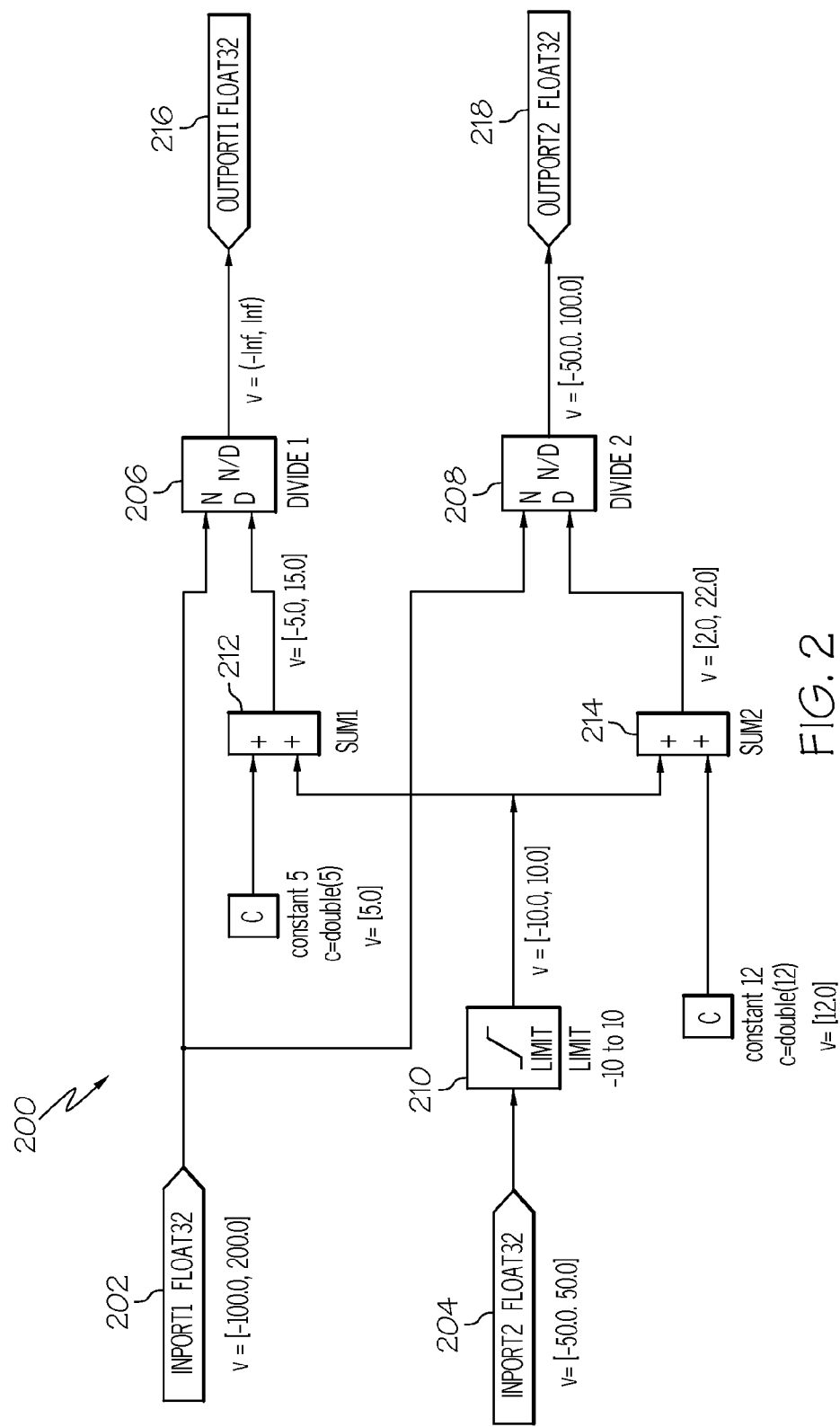
FIG. 2 illustrates an example of a data flow model for a system under test in accordance with one embodiment.

FIG. 2 illustrates an example of how range propagation can be performed for a model 200 for a system under test as described in U.S. patent application Ser. No. 13/006,750 entitled "Type and Range Propagation through Data-Flow Models" filed on Jan. 14, 2011, the disclosure of which is hereby incorporated herein by reference in its entirety. The model 200 can include a first input signal block 202 and a second input signal block 204. An input signal block represents an input signal to the model. In an example, the first input signal can have a range of expected values of −100.0 to 200.0 (i.e., [−100.0, 200.0]). The expected values for the input signal can include the one or more values in which the input signal can have not including signal value error for the input signal. In this example, the second input signal can have a range of expected value of [−50.0, 50.0]. For simplicity, in this example, the floating-point type of all ranges is (T=Float32), however, it should be understood that other floating-point types can be used.

In model 200, the first input signal 202 is the input signal to the numerator of two functional blocks 206, 208 implementing a divide function. The second input signal 204 is the input signal to a function block 210 implementing a range limit function. Functional block 210 can limit the input signal to values within defined bounds (e.g., minimum and maximum bounds). Values outside the bounds can be constrained to the minimum or maximum bound as appropriate. In this example, functional block 210 can limit an input signal to the range [−10.0, 10.0]. Accordingly, for the range [−50.0, 50.0] of the second input signal 204, the range of the output signal for functional block 210, according to the range mapping function for functional block 210, is [−10.0, 10.0].

In model 200, the output signal from functional block 210 is input to two functional blocks 212, 214 implementing sum functions. The ranges for the other input signals to functional blocks 212, 214 are constants. Accordingly, the range for the output signal from functional block 212 is [−5.0, 15.0] and the range for the output signal from functional block 214 is [2.0, 22.0]. These output signals are provided to the functional blocks 206, 208. The range of the output signal from functional block 208 is [−50.0, 100.0], and the range of the output signal from functional block 206 is (−infinity, infinity) since the range of the input signal for the denominator of functional block 206 includes zero. The model 200 can include output signal blocks 216, 218 that are connected to the output signals of functional blocks 206, 208 respectively. An output signal block represents the output signal of the model. As shown, the value being input to output block 216 can spike to positive or negative infinity which may cause a run-time exception in the system under test.

To support detection of such potential exceptions, the range propagation routine for the divide block can include a check to ensure there is a safe region around zero of the denominators signal range. If this safe region is entered, a warning can be produced. This is an example of a block-centric range analysis that is built on top of range propagation. Examples of other checks includes: (i) determining if the ranges of the inputs signals of functional blocks implementing square root functions are greater than or equal to zero, (ii) determining if switch controller ranges are greater than or equal to one and less than or equal to the number of switched signals, and (iii) determining if signal ranges are contained within the minimum and maximum values of their associated language-independent types for integer data types (e.g., between 32,768 and 32,767 for a 16-bit integer).

Range propagation can also be used to prune the search space associated with requirements-based test generation as described in U.S. Pat. No. 7,644,334, entitled "Requirements-Based Test Generation" filed on Nov. 26, 2007, the disclosure of which is hereby incorporated herein by reference in its entirety.

In an example, the software verification tool does not rely on continuous dynamics or notion of time, as used in hybrid automata or time automata to capture and analyze a mix of continuous dynamics and discrete state transitions. This is not a limitation in practice, as exhaustive analysis is typically infeasible on complex practical models of a system under test. In fact, many large avionics control systems are currently designed using discrete time notation, from a practical perspective, since the flight code implementation uses periodic execution and scheduling. The advantage of the discrete approach for time representation is scalability on complex models, which has many practical benefits.

In order to analyze the effect of the structure of a model of a system under test as well as the effect of error on potential behavioral non-determinism, range propagation can be extended to also propagate signal value error and analyze its potential effect.

In order to capture signal value errors, the endpoints of all intervals I in range R have an associated signal value error. One or more intermediate values from a signal range may have associated signal value error represented. The more values for which signal value error is represented, the more accurate the error analysis can be. However, the computation required to perform the error propagation can also increase.

In one embodiment, an intermediate value in the range may have associated signal value error represented. Accordingly, the signal value error for the intermediate value can be propagated through a functional block to determine an intermediate value error range. The signal value error for the intermediate value can be sent through the function block by using the range mapping function in the same manner as discussed with respect to the signal value error for the endpoints of a range. In one example, the intermediate value for which signal value error is sent through the functional block can be a value near zero. In another embodiment, the intermediate value may be a midpoint in the range.

In one embodiment, the signal value error is represented as an interval associated with a particular value of the signal range. In an example, intermediate signal error values can be determined by interpolation of endpoint signal error values.

In another embodiment, the signal value error is represented as a single value, k, that is relative to all feasible values of a range. In an example, endpoint signal error values and/or intermediate signal value errors can be determined by multiplying the particular value of the range by the value k.

In yet another embodiment, the signal value error is represented as an error function of a value in the range. In this example, endpoint signal error values and/or intermediate signal value errors can be determined by applying the error function to the particular value of the range.

Figure 3:
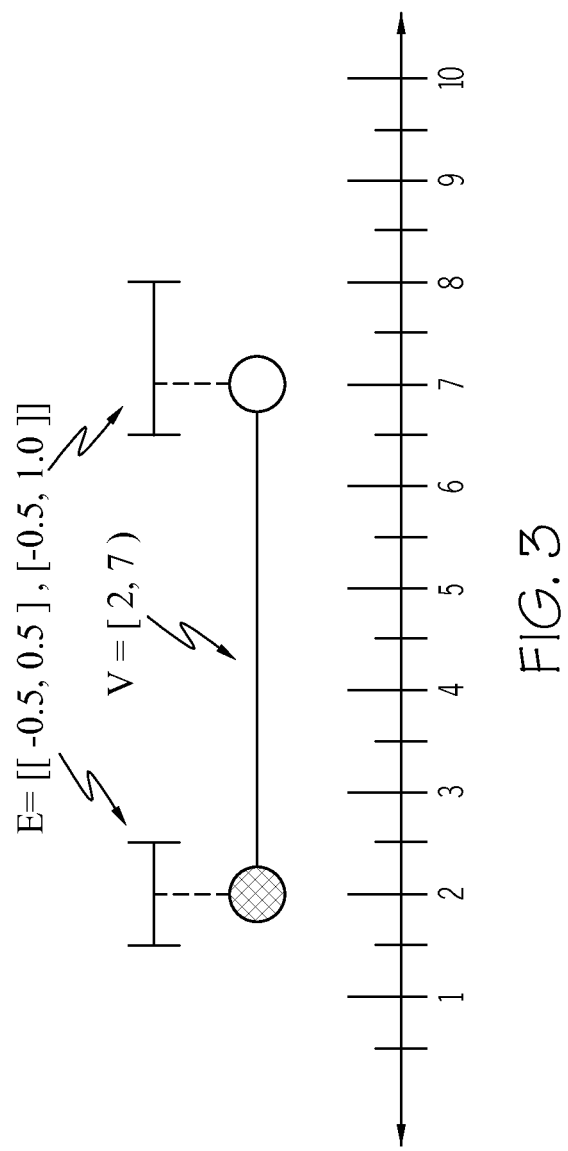
FIG. 3 illustrates an example of an interval and error ranges associated with endpoints of the interval.

FIG. 3 graphically illustrates how an error interval can be associated with both endpoints of an interval. It shows interval [2, 7) with minimum value error [−0.5, 0.5] and maximum value error [−0.5, 1.0]. In this example, the actual values observed may range from [1.5, 8).

Figure 4:
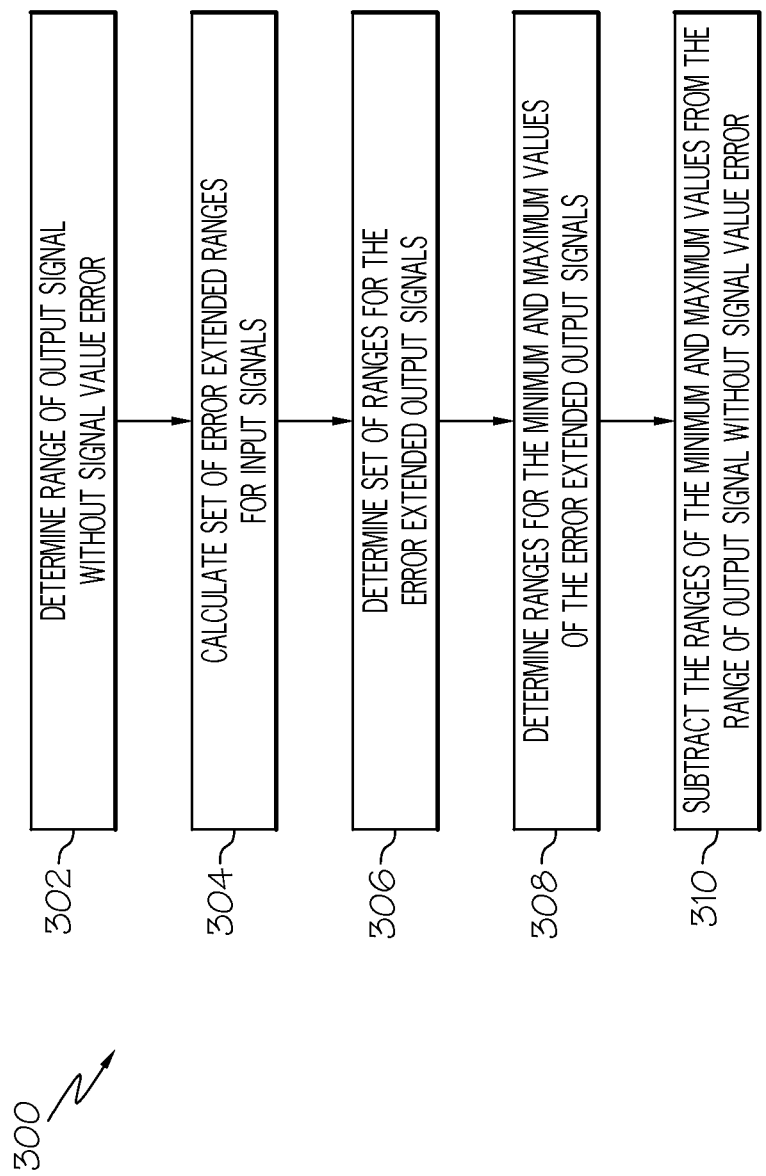
FIG. 4 illustrates a method for propagating signal value error through a functional block in a model in accordance with one embodiment.

FIG. 4 illustrates an example of a method 300 for propagating signal value error through a functional block in a model. In this example, method 300 is described with respect to a functional block b with n input signals having ranges that have been determined.

At block 302, one or more ranges for the one or more output signals of the functional block b can be determined as a function of the ranges corresponding to the expected values (e.g., without signal value error) for the n input signals as described with respect to FIG. 2. That is, range(s) for the output signal(s) can be determined using the range mapping function for the functional block b based on the range(s) of the expected values of the input signal(s) not including signal value error for the input signal(s). A range for an input signal can include a maximum value and a minimum value and one or more intervals.

At block 304, a set of error extended ranges for an input signal can be calculated. The set of error extended ranges for an input signal can include all permutations of the ranges of the signal value errors for the input signal added to the respective maximum and minimum values of the range of the input signal.

A set of error extended ranges for an input signal is calculated by adding the min and max of the signal value error intervals to each range interval endpoint. This results in m pairs of error extended ranges where m is the total number of end-points (e.g., unique min and max values in all intervals of a range.

At block 306, the set of ranges for the error extended output signals can be determined. The set of ranges for the error extended output signal can be determined by propagating each range of the set of error extended ranges for the input signals through the functional block. That is, each range of the set of error extended ranges for the first input signal is matched with each error extended range for the second and remaining input signals. All permutations of error extended ranges can be mapped to an error extended output signal range by using the range mapping function of the functional block b.

At block 308, the ranges of the minimum and maximum values for the set of ranges of error extended output values can be determined. Each range in the set of ranges of error extended output values has a maximum and a minimum value. Accordingly, the maximum values of the set of ranges occupy a certain range and the minimum values of the set of ranges occupy a certain range. These ranges are determined accordingly.

At block 310, the ranges for the minimum and maximum values for the set of ranges of error extended output values can be subtracted from the minimum and maximum value from the range of output signal determined at block 302 to determine the ranges of signal value error for the output signal of the functional block b. That is, a range of signal value error corresponding to the maximum value in the range of the output signal determined at block 302 can be determined as the range of the maximum values for the set of error extended output values subtracted from the maximum value of the range of output signal determined in block 302. Similarly, a range of signal value error corresponding to the minimum value in the range of the output signal determined at block 302 can be determined as the range of the minimum values for the set of error extended output values subtracted from the minimum value of the range of output signal determined in block 302.

Once determined the range of the output signal (without error) as determined in block 302 and the ranges for the signal value error corresponding to the output signal can be provided to a functional block downstream from the functional block b. In examples where the functional block b has multiple output signals, the method 300 can be performed for each output signal.

Example pseudocode for method 300 is as follows:

```
1:  propagate the set of ranges through the incident block, b, as normal to
    result in output signal ranges without error
2:  for all input signal ranges, r, of block b do
3:      for all endpoints v of r do
4:          create two error-extended endpoint values by adding to v the min
            and max values of its associated error
5:      end for
6:  end for
7:  create all feasible combinations of error-extended ranges from
    error-extended endpoint values
8:  for all combinations of error-extended ranges do
9:      propagate the error-extended range through b to result in a set of
        error-extended output ranges
10: end for
11: for all endpoints of the output signal ranges without error do
12:     determine the min and max values among all of the associated
        error-extended endpoint values
13:     compute the error at the endpoint by subtracting these min and
        max values
14: end for
```

In other examples, a range of signal value error can be calculated at intermediate values other than or in addition to the maximum and minimum values for the range of the output signal by following method 300. For example, a range of signal value error can be computed at zero or at a midpoint value in the range of the output signal. In an example, these signal value errors can be captured by introducing intervals in the range and using the interval endpoints to define their respective set of ranges for signal value error.

Method 300 can be performed for all functional blocks in a model in order to propagate range and associated signal value error through a model. For example, method 300 can be used for multiple or all blocks in a model for a system under test. Using method 300 range values and error values associated with the range values can be propagated through a plurality of functional blocks corresponding to the model of a system under test by calculating in topological order output signal ranges and minimum output signal error ranges and a maximum output signal error ranges for the plurality of functional blocks receive. This process can be used to perform block-centric analysis on the error extended input signal ranges of one or more functional blocks in the model to determine if error extended anomalies are possible. In an example, if an error extended anomaly is determined for one or more functional blocks an error (e.g., a warning) can be output to alert a user that the model may include an error extended anomaly.

Figure 5:
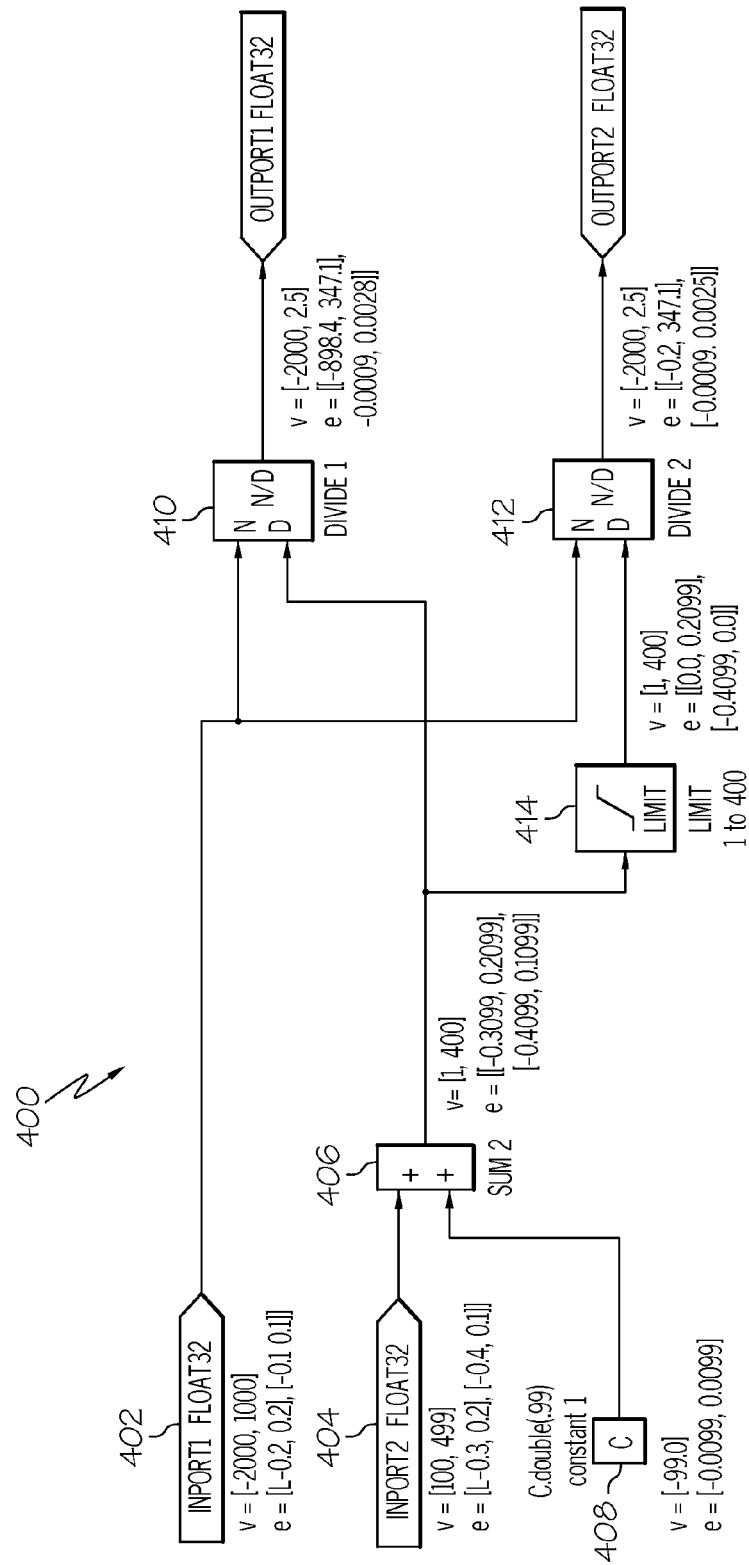
FIG. 5 illustrates a data flow model for a system under test in which signal value error is propagated through the model in accordance with one embodiment.

FIG. 5 illustrates an example of a model 400 for a system under test in which signal value error is propagated through the model 400. Model 400 includes a first input signal 402 and a second input signal 404 with ranges of [−2000.0 1000.0] and [100.0 499.0], respectively. For simplicity, model 400 uses floating-point types of all ranges (T=Float32), and does not show type information. The signal value error associated with the minimum and maximum signal values are given from the below the ranges. For example, the signal value error associated with the range of input signal 402 is [−0.2, 0.2] at the min value of −2000 and [−0.1, 0.1] at the max value of 1000. So output signal values can be expected ranging anywhere from −2000.2 to 1000.1. Similarly, the signal value error associated with the range of input signal 404 is [−0.3, 0.2] at the min value of 100 and [−0.4, 0.1] at the max value of 499.

Computing the signal value error at the output of functional block 406, which implements a sum function, involves first computing the range of the output signal without signal value error. This is [1, 400]. Next the set of error extended input signal values are computed. These are [99.7, 498.6], [99.7, 499.1], [100.2, 498.6], [100.2, 499.1] from input signal 404 and [−99.0099], [−98.9901] for the constant 408. All permutations of these two sets of error extended values are propagated through the functional block 406. Hence, the set of ranges for the error extended output signal is: RMFsum ([99.7, 498.6], [−99.0099])=[0.6901, 399.5901], RMFsum ([99.7, 499.1], [−99.0099])=[0.6901, 400.0901], RMFsum ([100.2, 498.6], [−99.0099])=[1.1901, 399.5901], RMFsum ([100.2, 499.1], [−99.0099])=[1.1901, 400.0901], RMFsum ([99.7, 498.6], [−98.9901])=[0.7099, 399.6099], RMFsum ([99.7, 499.1], [−98.9901])=[0.7099, 400.1099], RMFsum ([100.2, 498.6], [−98.9901])=[1.2099, 399.6099], RMFsum ([100.2, 499.1], [−98.9901])=[1.2099, 400.1099], where RMFsum is the range mapping function of functional block 406. In this case RMFsum can specify that the inputs' minimum values can be added together to get the output minimum value and the inputs' maximum values can be added together to get the output maximum value.

Finally, the smallest and largest low and high error extended values are subtracted from the output range that was computed without error, as such [0.6901, 1.2099]−[1]=[−0.3099, 0.2099] and [399.5901, 400.1099]−[400]=[−0.4099, 0.1099] to result in an output signal with range [1, 400], low value error of [−0.3099, 0.2099], and high value error of [−0.4099, 0.1099].

FIG. 5 shows the values without error as well as the corresponding low and high signal value errors for each signal as it is propagated through the model 400. Note the large error that is the result of performing the computation of functional block 406 and feeding the results directly into the denominator of the functional block 410 which implements a divide function. The resulting high end error is [−898.4, 347.1]. This shows how particular multi-block structures can amplify error unexpectedly. The signal value error for functional block 412, implementing a divide function, is mitigated somewhat due to the functional block 414 implementing a range limiter function.

Figure 6:
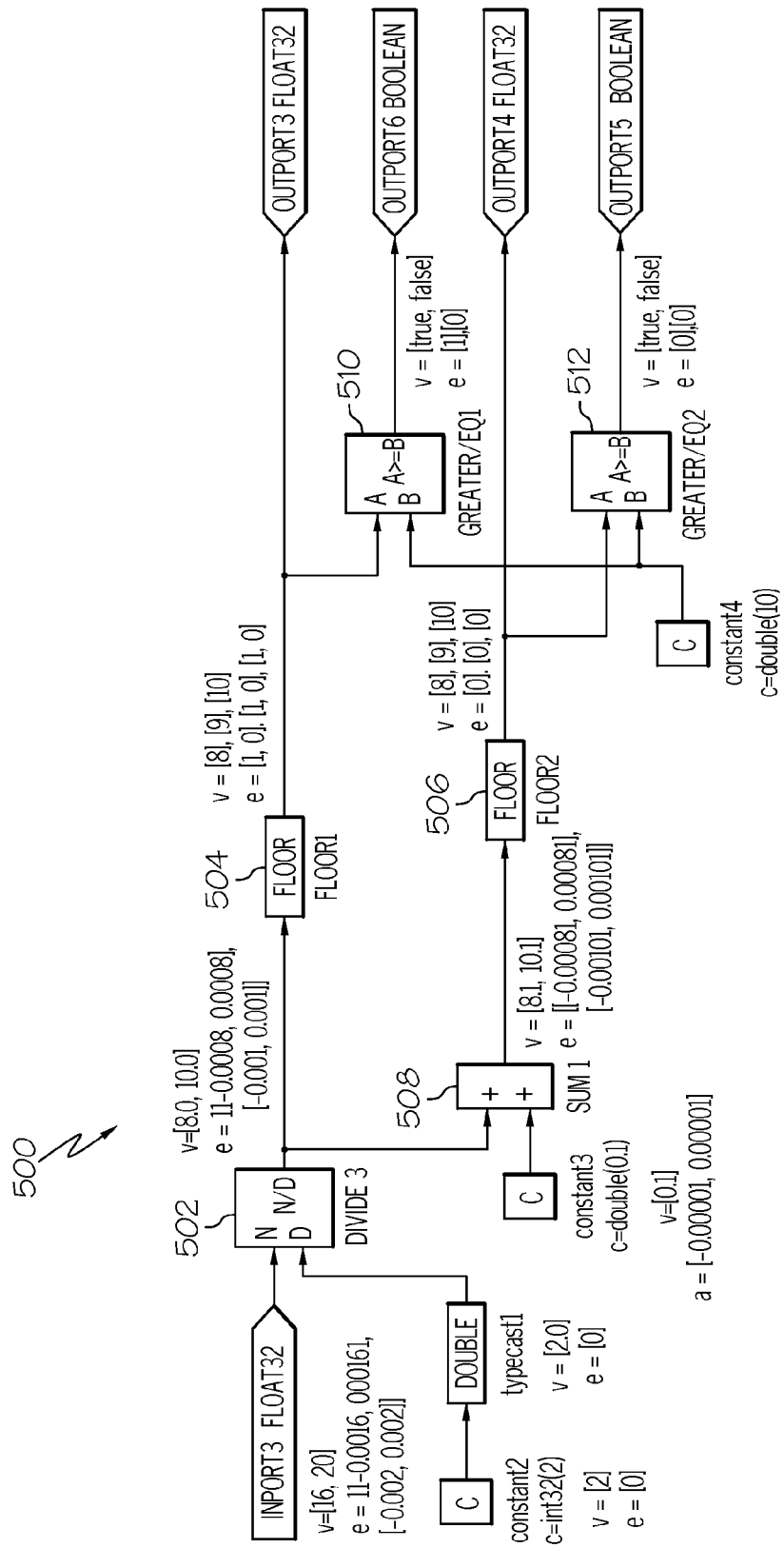
FIG. 6 illustrates a data flow model for a system under test having both continuous and discrete signals in which signal value error is propagated through the model in accordance with one embodiment.

FIG. 6 illustrates an example of a model 500 for a system under test having both continuous and discrete signals in which signal value error is propagated through the model 500. In this model, the output of the functional block 502 implementing a divide function is provided directly to the functional block 504 implementing a floor function. The output of functional block 502 is also indirectly provided to the functional block 506 also implementing a floor function, via the functional block 508 implementing a sum function that adds a small offset value. The function of a floor block is to convert a real variable into a whole number by computing the greatest integer less than the input value.

By following the method 300, the input signal range to functional block 504 can be computed as [8.0, 10.0] with range for the low signal value error of [−0.0008, 0.0008] and range for the high signal value error of [−0.001, 0.001].

Following the method 300, the range of the output signal without error is determined for functional block 504. This range includes the whole numbers 8, 9, and 10. No values between the whole numbers are included. Next the set of error extended input signal values are computed. These are [7.9992], [8.0008], [9.999], [10.001]. All these error-extended values are propagated through the functional block 504. Hence, RMFfloor([7.9992])=[7], RMFfloor([8.0008])= [8], RMFfloor([9.999])=[9], RMFfloor([10.001])=[10].

Finally, the smallest and largest low and high error-propagated values are subtracted from the output range that was computed without error, as such [7]−[8]=[1]; [8]−[8]=[0]; [9]−[10]=[1]; [10]−[10]=[0]; to result in an output signal with range [8, 10], range for the low signal value error of [1, 0], and range for the high signal value error of [1, 0]. Note that the signal value error can be computed for the value nine of this range if the signal value error associated with this value is computed (e.g., by interpolation) at the inputs of model 500 and propagated through the model 500.

As can be seen, the output of functional block 506 has an associated signal value error of [0, 0]. The reason is that since the small offset added to the output of the functional block 502 is greater than the signal value error at that point, it is not possible for the minimum signal value error to pull the signal value down to result in the next lower integer value. In the past the offset value has needed to be estimated. Using method 300, the offset can be determined by computing the propagated error at the signal just prior to the functional block 508. Then the value of the constant3 block should be set slightly greater than the high end max error value to eliminate all downstream error.

Propagation of signal value error through a model can be performed topologically from input signals to the model, following the direction of the connections between functional blocks. After the signal value error associated with the input ports of a functional block have been determined, the signal value error associated with the output ports can be computed. By following method 300, it may be difficult for the signal value error to be computed in the case of feedback loops on all input ports for one or more functional blocks. This is because the signal value error at the input ports may be directly or indirectly dependent upon the signal value error associated with the output ports of the same or downstream functional blocks. Nested feedback structures are also possible.

One embodiment that addresses the issue of feedback signals in models is to develop a library of common feedback patterns that are comprised of structures of blocks and wires. For each pattern, a range mapping function can be written. After this library is created, it can be applied on any model as follows: (i) detect instances of any of the feedback patterns, (ii) to replace the detected structures with a single functional block in which the feedback is internal to the block. (iii) This new functional block can be handled the same way as other functional blocks.

Figure 7:
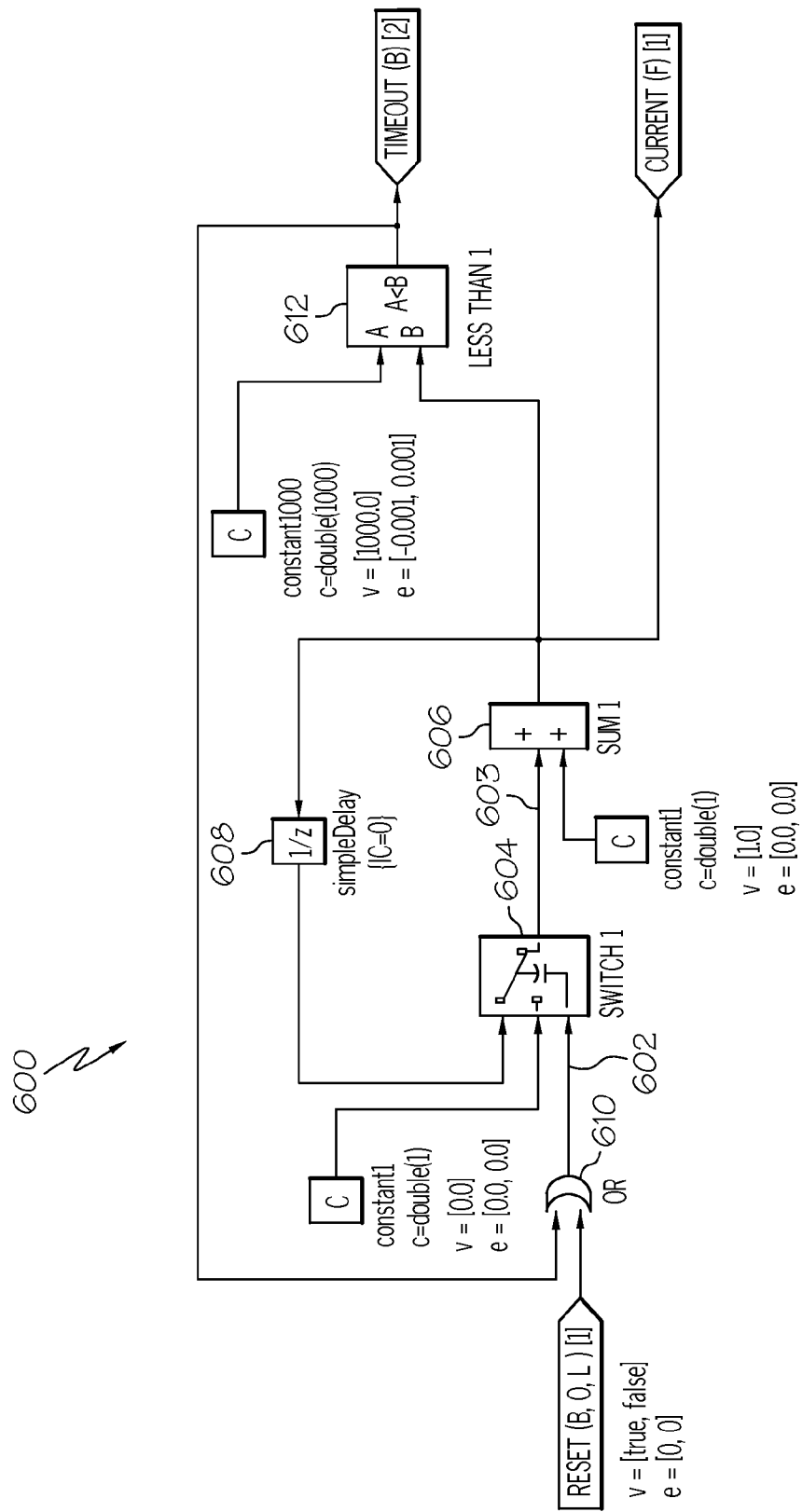
FIG. 7 illustrates a model having a feedback signal in accordance with one embodiment.
Figure 8:
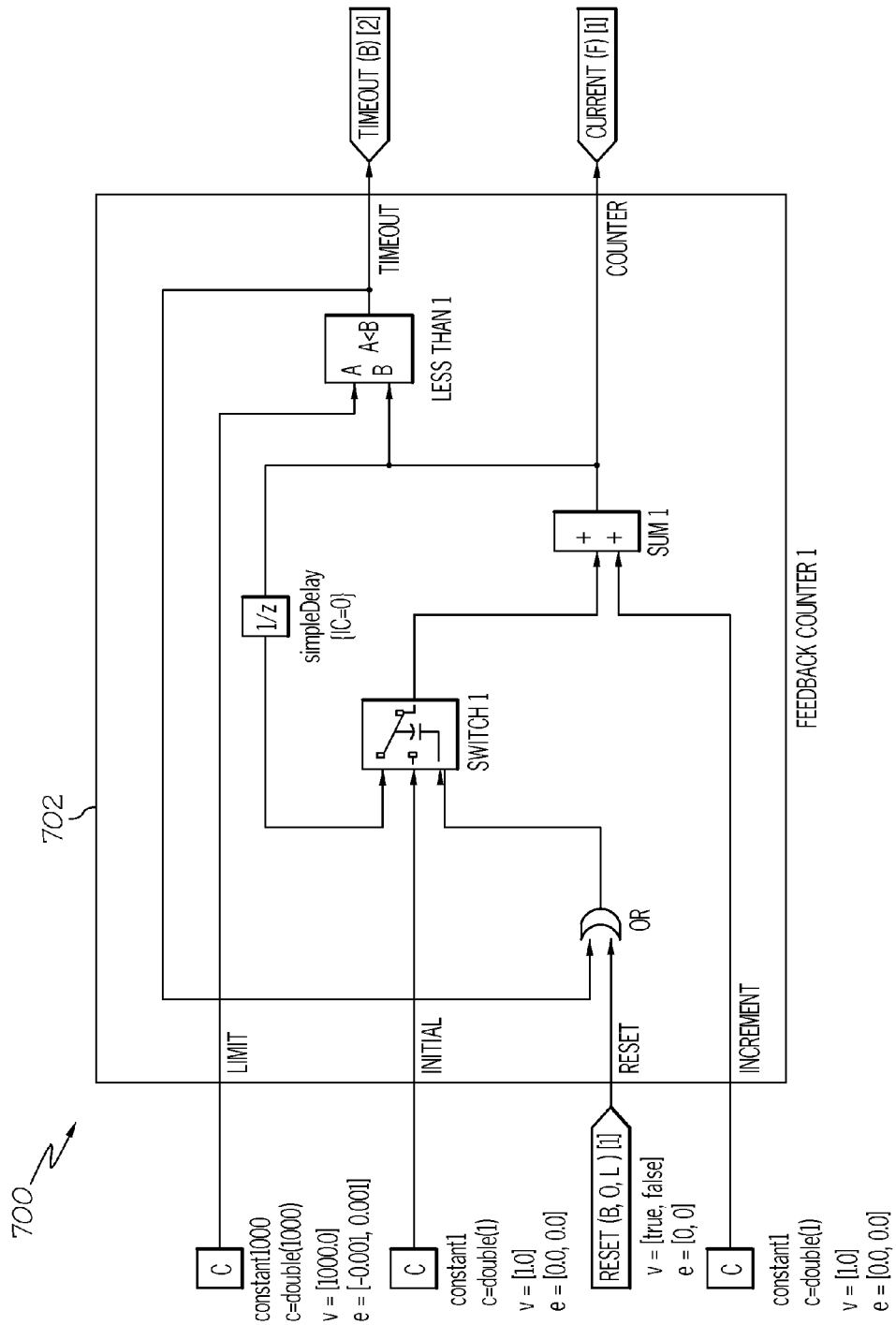
FIG. 8 illustrates a model in which the pattern of a feedback loop from FIG. 6 has been replaced with the functional block implementing a feedback counter function.

FIGS. 7 and 8 illustrate this method. FIG. 7 illustrates model 600 with feedback signals 602 and 603. In this model 600, it may not be possible to compute the signal value error on all of the inputs of the functional block 604, implementing a switch function, using only a topological algorithm. This is because one of the input signals for functional block 604 depends (indirectly through the functional block 606 (implementing a sum function) and the functional blocks 608 (implementing a delay function)) on its output signal 603.

Similarly, it is not possible to compute the signal value error on all of the inputs of the functional block 610 that implements a logical OR function due to feedback signal 602. In one embodiment, a pattern recognizer can be used to detect the existence of the particular structure of a plurality of functional blocks (e.g., functional blocks 604, 606, 608, 610, 612) and replace the pattern with a single functional block.

FIG. 8 illustrates a model 700 in which the pattern of the feedback loop from FIG. 7 has been replaced with the functional block 702 implementing a feedback counter function. Note in FIG. 8, the internals of the functional block 702 are shown, but in other examples the internals are not shown. The model 700 of FIG. 8 no longer has a feedback loop. Hence the method 300 can be successfully applied to the model 700

In one example, the range mapping function for the functional block 702 can be dependent upon the number of iterations through the loop. The range mapping function can statically compute the bound of the number of iterations through the loop in order to compute a tight range and error bound for the model 700.

For nested feedback structures, start with the leaf-level feedback structures and perform pattern identification and replacement. Then move up to the next higher level, and so on.

Another embodiment that addresses the issue of feedback signals in models is to automatically break the feedback loop by determining the feed back signals and setting a default (and conservative) error value to those signals. This error value may be dependent upon a bound of the number of iterations through the feedback structure.

In an example, certain classes of functional blocks perform computations that take continuous input signals and produce output signals that vary in discrete increments. For example, rounding operators such floor, round, ceiling, and fix convert a continuous signal into a discrete signal that varies in integer increments. Likewise comparison operators, such as greaterEq1 510 and greaterEq2 512 in FIG. 6, may compare two continuous signals and produce a Boolean output signal. For this class of blocks, the impact of error may be much greater than the mere propagation of the error to the output results; the error can cause non-deterministic and/or anomalous behavior.

For these classes of blocks, analysis of the model can be implemented for several classes of blocks to report any potential for non-determinism. The analysis can be performed by a number of methods, in particular (i) extended-type checking and (ii) evaluating block-specific predicates over the set of intervals and errors.

For example, the error margins at the decisions points that impact the block behavior can be analyzed to determine if they can potentially affect the result. In the example of FIG. 6, the software would check at both greater-than blocks 510 and 512 to determine if the error of either or both of the input signal ranges can individually or in conjunction cause an otherwise true result to evaluate to false or an otherwise false result to evaluate to true. This analysis can determine that for the block greaterEq1 510, the error in the signal from floor 1 block 504 can cause an otherwise true result to evaluate to false (i.e., when v=[10] and e=[1]).

Although specific embodiments have been illustrated and described herein, it will be appreciated by those of ordinary skill in the art that any arrangement, which is calculated to achieve the same purpose, may be substituted for the specific embodiments shown. Therefore, it is manifestly intended that this invention be limited only by the claims and the equivalents thereof.

Example Embodiments

Example 1 includes a method comprising: providing an input signal range corresponding to a range of expected values for an input signal to a functional block; providing a minimum value error range corresponding to a range of error for a minimum value endpoint of the input signal range and a maximum value error range corresponding to a range of error for a maximum value endpoint of the input signal range; mapping the input signal range to one or more output signal ranges as a function of a range mapping function corresponding to the functional block; calculating a set of error extended input signal ranges by: adding a min endpoint of the minimum value error range to the minimum value of the input signal range; adding a max endpoint of the minimum value error range to the minimum value of the input signal range; adding the min endpoint of the maximum value error range to the maximum value of the input signal; and adding the max endpoint of the maximum value error range to the maximum value of the input signal range; mapping the set of error extended input signal ranges to a set of error extended output signal ranges as a function of the range mapping function; and calculating a minimum output error range and a maximum output error range as a function of a difference between the set of error extended output signal ranges and the output signal ranges.

Example 2 includes a system comprising: at least one processing device; at least one memory device coupled to the at least one processing device, the at least one memory device having instructions thereon for execution by the at least one processing device, wherein the instructions, when executed by the at least one processing device, cause the at least one processing device to: receive an input signal range corresponding to a range of expected values for an input signal to a functional block; receive a minimum value error range corresponding to a range of error for a minimum value endpoint of the input signal range and a maximum value error range corresponding to a range of error for a maximum value endpoint of the input signal range; map the input signal range to one or more output signal ranges as a function of a range mapping function corresponding to the functional block; calculate a set of error extended input signal ranges by: adding a min endpoint of the minimum value error range to the minimum value of the input signal range; adding a max endpoint of the minimum value error range to the minimum value of the input signal range; adding the min endpoint of the maximum value error range to the maximum value of the input signal; and adding the max endpoint of the maximum value error range to the maximum value of the input signal range; map the set of error extended input signal ranges to a set of error extended output signal ranges as a function of the range mapping function; and calculate a minimum output error range and a maximum output error range as a function of a difference between the set of error extended output signal ranges and the output signal ranges.

Example 3 includes a computer readable medium including instructions which, when executed by at least one processor, cause the at least one processor to: receive an input signal range corresponding to a range of expected values for an input signal to a functional block; receive a minimum value error range corresponding to a range of error for a minimum value endpoint of the input signal range and a maximum value error range corresponding to a range of error for a maximum value endpoint of the input signal range; map the input signal range to one or more output signal ranges as a function of a range mapping function corresponding to the functional block; calculate a set of error extended input signal ranges by: adding a min endpoint of the minimum value error range to the minimum value of the input signal range; adding a max endpoint of the minimum value error range to the minimum value of the input signal range; adding the min endpoint of the maximum value error range to the maximum value of the input signal; and adding the max endpoint of the maximum value error range to the maximum value of the input signal range; map the set of error extended input signal ranges to a set of error extended output signal ranges as a function of the range mapping function; and calculate a minimum output error range and a maximum output error range as a function of a difference between the set of error extended output signal ranges and the output signal ranges.

In Example 4 the subject matter of any of Examples 1-3 can optionally include wherein calculating a set of error extended input signal ranges includes calculating permutations of the min and max endpoints of the minimum value error interval added to the minimum value of the input signal range and the maximum value error range added to the maximum value of the input signal range.

In Example 5, the subject matter of any of Examples 1-4 can optionally include wherein each error extended output signal range has a minimum value and a maximum value; wherein calculating a minimum output error range includes calculating a difference between a smallest of the minimum values of the set of error extended output signal ranges and a minimum value of the output signal range, and calculating a difference between a largest of the minimum values of the set of error extended output signal ranges and the minimum value of the output signal range; and wherein calculating a maximum output error range includes calculating a difference between a smallest of the maximum values of the set of error extended output signal ranges and a maximum value of the output signal range, and calculating a difference between a largest of the maximum values of the set of error extended output signal ranges and the maximum value of the output signal range.

In Example 6, the subject matter of any of Examples 1-5 can optionally include: providing an intermediate value error range corresponding to a range of error for an intermediate value of the input signal range; mapping the intermediate value to a corresponding one or more output intermediate value as a function of the range mapping function; calculating a set of error extended intermediate signal valued by: adding the min endpoint of the intermediate value error range to the intermediate value of the input signal range; adding the max endpoint of the intermediate value error range to the intermediate value of the input signal range; mapping the set of error extended intermediate values to a set of error extended output intermediate values as a function of the range mapping function; and calculating an intermediate value output error range as a function of a difference between the set of error extended output intermediate values and the error extended intermediate values.

In Example 7, the subject matter of any of Examples 1-6 can optionally include wherein the input signal range consists of a constant value.

In Example 8, the subject matter of any of Examples 1-7 can optionally include wherein the input signal range includes two or more intervals, and wherein each interval has a corresponding minimum value error range and a maximum value error range, and calculating output signal error ranges corresponding to the two or more intervals.

In Example 9, the subject matter of any of Examples 1-8 can optionally include: performing block-centric analysis on the error extended input signal ranges to determine if error extended anomalies are possible.

In Example 10, the subject matter of any of Examples 1-9 can optionally include: propagating range values and error values associated with the range values through a plurality of functional blocks corresponding to a model of a system under test by calculating in topological order output signal ranges and minimum output signal error ranges and a maximum output signal error ranges for the plurality of functional blocks receive.

In Example 11, the subject matter of any of Examples 1-10 can optionally include wherein the model includes one or more feedback signals; detecting a feedback pattern; and replacing the feedback pattern with a functional block prior to propagating range values and error values.

In Example 12, the subject matter of any of Examples 1-11 can optionally include wherein the functional block receives a plurality of input signals, and wherein the input signal range corresponds to at least one of the plurality of input signals.

What is claimed is:

1. A method comprising:
    providing an input signal range corresponding to a range of expected values for an input signal to a functional block;
    providing a minimum value error range corresponding to a range of error for a minimum value endpoint of the input signal range and a maximum value error range corresponding to a range of error for a maximum value endpoint of the input signal range;
    mapping the input signal range to one or more output signal ranges as a function of a range mapping function corresponding to the functional block;
    calculating a set of error extended input signal ranges by:
        adding a min endpoint of the minimum value error range to the minimum value of the input signal range;
        adding a max endpoint of the minimum value error range to the minimum value of the input signal range;
        adding the min endpoint of the maximum value error range to the maximum value of the input signal; and
        adding the max endpoint of the maximum value error range to the maximum value of the input signal range;
    mapping the set of error extended input signal ranges to a set of error extended output signal ranges as a function of the range mapping function; and
    calculating a minimum output error range and a maximum output error range as a function of a difference between the set of error extended output signal ranges and the output signal ranges.

2. The method of claim 1, wherein calculating a set of error extended input signal ranges includes calculating permutations of the min and max endpoints of the minimum value error interval added to the minimum value of the input signal range and the min and max endpoints of the maximum value error range added to the maximum value of the input signal range.

3. The method of claim 1, wherein each error extended output signal range has a minimum value and a maximum value;
    wherein calculating a minimum output error range includes calculating a difference between a smallest of the minimum values of the set of error extended output signal ranges and a minimum value of the output signal range, and calculating a difference between a largest of the minimum values of the set of error extended output signal ranges and the minimum value of the output signal range; and
    wherein calculating a maximum output error range includes calculating a difference between a smallest of the maximum values of the set of error extended output signal ranges and a maximum value of the output signal range, and calculating a difference between a largest of the maximum values of the set of error extended output signal ranges and the maximum value of the output signal range.

4. The method of claim 1, comprising:
    providing an intermediate value error range corresponding to a range of error for an intermediate value of the input signal range;
    mapping the intermediate value to a corresponding one or more output intermediate value as a function of the range mapping function;
    calculating a set of error extended intermediate signal valued by:
        adding the min endpoint of the intermediate value error range to the intermediate value of the input signal range;
        adding the max endpoint of the intermediate value error range to the intermediate value of the input signal range;
    mapping the set of error extended intermediate values to a set of error extended output intermediate values as a function of the range mapping function; and
    calculating an intermediate value output error range as a function of a difference between the set of error extended output intermediate values and the error extended intermediate values.

5. The method of claim 1, wherein the input signal range consists of a constant value.

6. The method of claim 1, wherein the input signal range includes two or more intervals, and wherein each interval has a corresponding minimum value error range and a maximum value error range, the method further comprising:
    calculating output signal error ranges corresponding to the two or more intervals.

7. The method of claim 1, wherein the method further comprises:
    performing block-centric analysis on the error extended input signal ranges to determine if error extended anomalies are possible.

8. The method of claim 1, comprising:
    propagating range values and error values associated with the range values through a plurality of functional blocks corresponding to a model of a system under test by calculating in topological order output signal ranges, minimum output signal error ranges, and maximum output signal error ranges for the plurality of functional blocks.

9. The method of claim 8, wherein the model includes one or more feedback signals, the method further comprising:
    detecting a feedback pattern; and
    replacing the feedback pattern with a functional block prior to propagating range values and error values.

10. The method of claim 1, wherein the functional block receives a plurality of input signals, and wherein the input signal range corresponds to at least one of the plurality of input signals.

11. A system comprising:
    at least one processing device;
    at least one memory device coupled to the at least one processing device, the at least one memory device having instructions thereon for execution by the at least one processing device, wherein the instructions, when executed by the at least one processing device, cause the at least one processing device to:
        receive an input signal range corresponding to a range of expected values for an input signal to a functional block;
        receive a minimum value error range corresponding to a range of error for a minimum value endpoint of the input signal range and a maximum value error range corresponding to a range of error for a maximum value endpoint of the input signal range;
map the input signal range to one or more output signal ranges as a function of a range mapping function corresponding to the functional block;
calculate a set of error extended input signal ranges by:
adding a min endpoint of the minimum value error range to the minimum value of the input signal range;
adding a max endpoint of the minimum value error range to the minimum value of the input signal range;
adding the min endpoint of the maximum value error range to the maximum value of the input signal; and
adding the max endpoint of the maximum value error range to the maximum value of the input signal range;
map the set of error extended input signal ranges to a set of error extended output signal ranges as a function of the range mapping function; and
calculate a minimum output error range and a maximum output error range as a function of a difference between the set of error extended output signal ranges and the output signal ranges.

12. The system of claim 11, wherein each error extended output signal range has a minimum value and a maximum value;
wherein calculate a minimum output error range includes calculate a difference between a smallest of the minimum values of the set of error extended output signal ranges and a minimum value of the output signal range, and calculate a difference between a largest of the minimum values of the set of error extended output signal ranges and the minimum value of the output signal range; and
wherein calculate a maximum output error range includes calculate a difference between a smallest of the maximum values of the set of error extended output signal ranges and a maximum value of the output signal range, and calculate a difference between a largest of the maximum values of the set of error extended output signal ranges and the maximum value of the output signal range.

13. The system of claim 11, wherein the instructions, when executed by the at least processor, cause the processor to:
receive an intermediate value error range corresponding to a range of error for an intermediate value of the input signal range;
map the intermediate value to a corresponding one or more output intermediate value as a function of the range mapping function;
calculate a set of error extended intermediate signal valued by:
add the min endpoint of the intermediate value error range to the intermediate value of the input signal range;
add the max endpoint of the intermediate value error range to the intermediate value of the input signal range;
map the set of error extended intermediate values to a set of error extended output intermediate values as a function of the range mapping function; and
calculate an intermediate value output error range as a function of a difference between the set of error extended output intermediate values and the error extended intermediate values.

14. The system of claim 11, wherein the instructions, when executed by the at least one processor, cause the at least one processor to:
perform block-centric analysis on the error extended input signal ranges to determine if error extended anomalies are possible.

15. The system of claim 11, wherein the instructions, when executed by the at least one processor, cause the at least one processor to:
propagate range values and error values associated with the range values through a plurality of functional blocks corresponding to a model of a system under test by calculating in topological order output signal ranges, minimum output signal error ranges, and maximum output signal error ranges for the plurality of functional blocks.

16. The system of claim 15, wherein the model includes one or more feedback signals, wherein the instructions, when executed by the at least one processor, cause the at least one processor to:
detect a feedback pattern; and
replace the feedback pattern with a functional block prior to propagate range values and error values.

17. A non-transitory computer readable medium including instructions which, when executed by at least one processor, cause the at least one processor to:
receive an input signal range corresponding to a range of expected values for an input signal to a functional block;
receive a minimum value error range corresponding to a range of error for a minimum value endpoint of the input signal range and a maximum value error range corresponding to a range of error for a maximum value endpoint of the input signal range;
map the input signal range to one or more output signal ranges as a function of a range mapping function corresponding to the functional block;
calculate a set of error extended input signal ranges by:
adding a min endpoint of the minimum value error range to the minimum value of the input signal range;
adding a max endpoint of the minimum value error range to the minimum value of the input signal range;
adding the min endpoint of the maximum value error range to the maximum value of the input signal; and
adding the max endpoint of the maximum value error range to the maximum value of the input signal range;
map the set of error extended input signal ranges to a set of error extended output signal ranges as a function of the range mapping function; and
calculate a minimum output error range and a maximum output error range as a function of a difference between the set of error extended output signal ranges and the output signal ranges.

18. The non-transitory computer readable medium of claim 17, wherein the instructions, when executed by the at least one processor, cause the at least one processor to:
perform block-centric analysis on the error extended input signal ranges to determine if error extended anomalies are possible.

19. The non-transitory computer readable medium of claim 17, wherein the instructions, when executed by the at least one processor, cause the at least one processor to:
propagate range values and error values associated with the range values through a plurality of functional blocks corresponding to a model of a system under test by calculating in topological order output signal ranges, minimum output signal error ranges, and maximum output signal error ranges for the plurality of functional blocks.

20. The non-transitory computer readable medium of claim 19, wherein the model includes one or more feedback signals, wherein the instructions, when executed by the at least one processor, cause the at least one processor to:
- detect a feedback pattern; and
- replace the feedback pattern with a functional block prior to propagate range values and error values.

* * * * *